Feb. 11, 1969 D. F. HILBIBER 3,427,513

LATERAL TRANSISTOR WITH IMPROVED INJECTION EFFICIENCY

Filed March 7, 1966 Sheet 1 of 2

INVENTOR.

DAVID F. HILBIBER,

BY Roger L. Borovoy & Stuart Lubitz

ATTORNEYS.

INVENTOR.
DAVID F. HILBIBER,
BY Roger L. Borovoy
Stuart Lubitz
ATTORNEYS.

United States Patent Office 3,427,513

Patented Feb. 11, 1969

3,427,513

LATERAL TRANSISTOR WITH IMPROVED INJECTION EFFICIENCY

David F. Hilbiber, Los Altos, Calif., assignor to Fairchild Camera and Instrument Corporation, Syossett, N.Y., a corporation of Delaware Filed Mar. 7, 1966, Ser. No. 532,379
U.S. Cl. 317—235 1 Claim
Int. Cl. H01l *19/00, 11/00*

ABSTRACT OF THE DISCLOSURE

A lateral transistor with improved injection efficiency having laterally disposed emitter, base, and collector regions. The emitter-base junction of the transistor has an impurity gradient at its bottom which is substantially steeper than the impurity gradient at its lateral sides adjacent the collector region, whereby the transistor displays an improved current gain and frequency response.

This invention relates to a lateral transistor structure and a method for forming such a structure.

For some time there has been a decided difficulty in fabricating a complementary transistor structure (e.g., a PNP and an NPN transistor in combination) in a monolithic functional block. Fabricating a PNP transistor and an NPN transistor in the same substrate has entailed either additional difficult-to-control processing steps or a sacrifice in isolation of the collector regions of one type of transistor. In order to overcome these problems in the fabrication of monolithic complementary transistor structures, a lateral transistor structure was recently described in the publication, "Lateral Complementary Transistor Structure for the Simultaneous Fabrication of Functional Blocks," by H. C. Lin et al., Electron Device Conference, Oct. 29, 1964. Briefly, when constructing a complementary transistor pair employing a lateral transistor structure, a double-diffused NPN transistor of conventional construction may be combined with a lateral PNP transistor to form the complementary pair or vice versa. During the p-type base diffusion of the NPN double-diffused transistor, two closely spaced concentric p-type regions are selectively diffused into an isolated n-type region such as used for the collector of the double-diffused transistor. One of the concentric p-type regions of the lateral transistor, such as the center p-type region, forms the emitter of the lateral transistor and the other p-type region, such as the outer region, forms the collector. The n-type spacing between the two p-type regions serves as the base.

In prior art lateral transistors, current is injected over the entire area of the emitter-base junction with very few of the carriers injected from the bottom and portions of the sides of the junction over reaching the collector. It is only the portion of the emitter-base junction closely spaced and adjacent the collector-base junction that is efficient in injecting carriers that reach the collector. Thus, much of the emitter-base junction has been inefficiently employed; the base transport current gain efficiency has been low. In addition, the effective base width in prior art devices increases as the distance below the surface increases resulting in the time required for a carrier to reach the collector not being constant. As a result, the collector rise and fall times have been relatively gradual and long. Finally, the frequency response of prior art devices has been decidedly limited by large base transit times which is the predominant factor in determining frequency response ($f_t$).

Briefly, the structure of the invention comprises a moncrystalline body having a first conductivity type and a surface, a first monocrystalline region having a conductivity type opposite the body and located adjacent the body to form a first pn junction. The first pn junction has a bottom and sides, with the sides extending to the surface. A second monocrystalline region has the same conductivity type as said first region and is located adjacent the body to form a second pn junction therewith. The second pn junction has a bottom and sides which extend to the surface with at least one of said sides in very close proximity to one of the sides of the first pn junction to enable a current to flow from one region to the other region. The bottom of the one junction from which current flows has an impurity gradient substantially steeper than the sides of that junction, whereby the lateral transistor displays an improved current gain and frequency response.

The above structure of this invention overcomes the deficiencies of the prior art by inhibiting injection of the emitter except from a portion of the junction nearest the surface which is substantially equidistant from the base-collector junction, by decreasing the base transit time and by providing additional recombination centers in the base region. The inhibiting of the emitter injection is accomplished by employing a higher bulk impurity concentration directly below the emitter than is employed in the remainder of the bulk. The higher impurity concentration in the bulk below the emitter results in a steeper junction impurity gradient in the vicinity of the bottom of the emitter-base junction than at the other portion of the junction. The steeper junction impurity gradient at the bottom results in a larger built-in voltage in the vicinity of the bottom of the emitter-base junction. With this built-in voltage opposing the forward bias voltage, current injection will predominantly occur at the emitter-base junction in the vicinity of the surface of the device. With injection occurring only at this portion of the emitter-base junction, the efficiency of the device is improved and the distance between the effective portion of the emitter-base junction and the base-collector junction is made substantially constant, thereby improving the rise-time and fall-time characteristics of the device. The current gain is similarly improved by at least an order of magnitude.

The device also may include a graded base region with a higher concentration of impurities than is usually possible in lateral transistor structures. This lowers the base transit time by providing a built-in field which accelerates carriers across the base and lowers the storage time by providing more recombination centers. Further, this lowers the parasitic base spreading resistance $r'_{bb}$.

The method of the invention comprises altering the impurity concentration of a monocrystalline body to provide a relatively high impurity concentration region in the body and forming an emitter region with its bottom in the vicinity of the higher impurity concentration region and its sides in the vicinity of the lower impurity concentration region.

The present invention is illustrated in the accompanying drawings, where:

Figure 1:
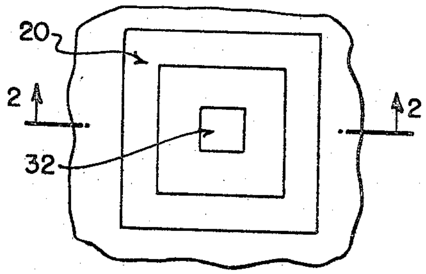
FIG. 1 is a plan view of the invented transistor structure.
Figure 2:
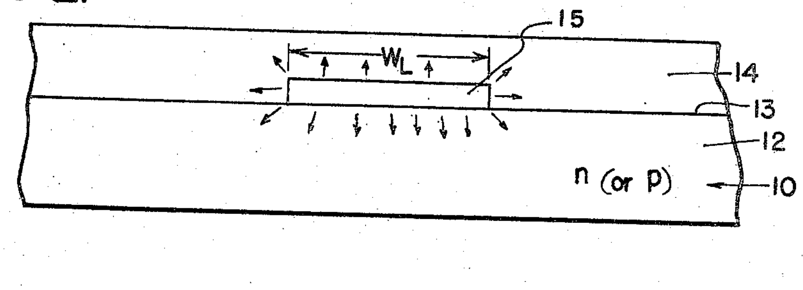
FIGS. 2–4 are enlarged sectional views taken along the lines 2—2 of FIG. 1 and showing the device at various stages of fabrication.
Figure 3:
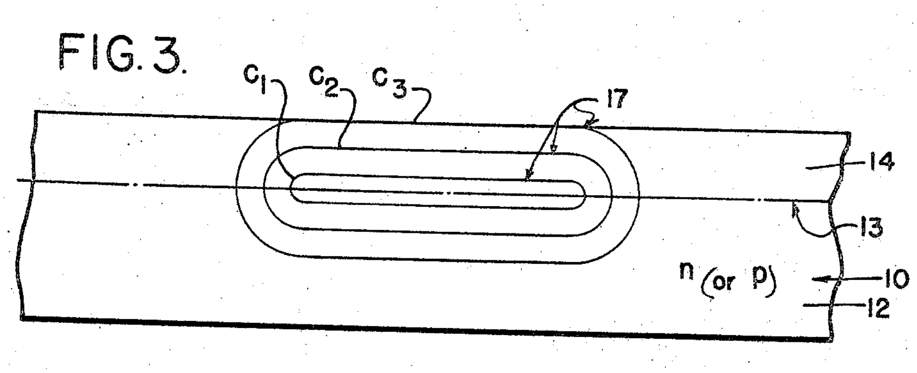

A lateral transistor structure is shown in various stages of processing in FIGS. 1–4. The lateral transistor includes a body 10 which, as shown in FIG. 2, may consist of a substrate region 12, which may have a conductivity type that is either n-type or p-type, depending on the application. Located on top of substrate 12 and defining a metallurgical junction is region 14, having a conductivity of n-type which may be obtained by such means as epitaxial growth or similar processes. Region 15 which is established at the interface 13 has a high impurity concentration of the same conductivity type as region 14, i.e., *n*+. The impurities contained in region 15 are permitted to diffuse into regions 12 and 14, as depicted in FIG. 3. Lines 17 (FIG. 3) are contours of constant impurity concentrations ($C_1>C_2>C_3$) where the highest concentration exists at the center, growing more lightly concentrated away from the center, hence a graded region. This gradient results in a built-in electrostatic field which has been described in U.S. Patent No. 3,059,123, issued to W. G. Pfann. The impurity concentrations relating to lines 17 are higher than the impurity concentration of region 14 and in general may be referred to as a higher impurity concentration region.

A first monocrystalline region 20 is located adjacent and within region 14, and having opposite conductivity type, i.e., *p*+ (FIG. 4), which forms a *pn* junction 22 with region 14. Junction 22 has a bottom 24 and sides 26 and 28 which extend to the surface 30 of body 10. The first region 20 which may function as the collector of the transistor has a closed path preferably, as shown in FIG. 1, and a regular substantially constant cross-section. A square geometry may be employed, but any of several other types may be employed without departing from the spirit of the invention, such as circular, rectangular, etc.

Figure 4:
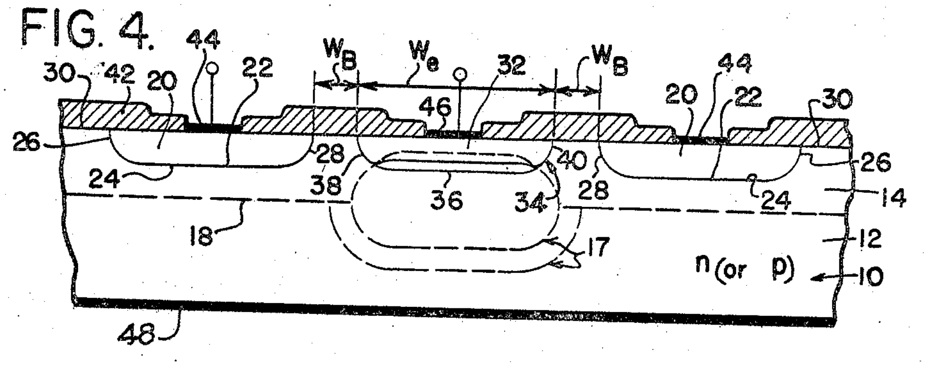

A second monocrystalline region 32 having a conductivity type opposite to region 14, that is, *p*+, is located substantially adjacent to region 20 and adjacent to region 14 (FIG. 4). Region 32 forms a junction 34 with region 14, consisting of a bottom 36 and sides 38 and 40 which extend to surface 30 of body 10. The sides 38 and 40 are located adjacent to but separated from side 28 of region 20 with a separation $W_B$ at the surface which is typically less than a few microns. The separation $W_B$ defines the base width of the base and separates first region 20 from second region 32, whereby region 32 may function as the emitter of the transistor.

An important aspect of the invention is the location of emitter region 32 adjacent to and in overlying relationship to the high impurity concentration region 17. The location of region 17 and its higher impurity concentration adjacent emitter region 32 and junction bottom 36 results in the junction bottom 36 having a relatively steep or high impurity gradient as compared with sides 38 and 40. In terms of concentration, typically, the impurity concentration of region 14 in the vicinity of the bottom of region 32 resulting from region 17 is $10^{17}$ atoms per cubic centimeter while the impurity concentration of the bulk in the vicinity of the sides 38 and 40 of the junction is approximately $10^{16}$ atoms per cubic centimeter or less.

In addition, there exists an impurity gradient across the distance $W_B$ which results from the diffusion of the impurities associated with region 15 (FIG. 2). This gradient and concentration characteristic gives rise to a number of significant results. First, the built-in impurity gradient in the base region adjacent to the surface facilitates the transport of minority carriers from the emitter 32 to collector 20 which phenomenon is explained in the above-mentioned patent to Pfann. It is further noted that as a result of the steeper gradient along junction bottom 36 as compared to sides 38 and 40, carrier injection along bottom 36 is less than along sides 38 and 40 by as much as a factor of 10 or more. Hence, for a given emitter-base forward bias, the bulk of the carrier injection occurs near the surface at which point the separation of emitter from collector is seen to be a minimum, thereby giving rise to maximum base transport efficiencies and minimum base transport times. A further consequence of the high impurity concentration associated with the base region is that the base spreading resistance is lowered significantly and base associated storage time is reduced substantially.

The lateral transistor of FIG. 4 is completed by passivating surface 30 with a suitable protective layer 42 which may be formed in accordance with U.S. Patent No. 3,025,589, issued Mar. 20, 1962, to J. A. Hoerni, and by attaching contacts 44, 46 and 48 to regions 20, 32 and 14, respectively, in accordance with techniques such as described in U.S. Patent No. 2,981,877, issued Apr. 25, 1961, to R. N. Noyce. The lateral transistor typically may form part of a monolithic functional block which includes a double-diffused transistor and other discrete components. The double-diffused transistor is formed simultaneously with the formation of regions 20 and 32. For example, the base of the double-diffused transistor is formed simultaneously with the formation of regions 20 and 32.

In operation, a potential is applied to contacts 46 and 48 which forward biases junction 34. The forward biasing of junction 34 results in carriers being injected from sides 38 and 40. The injected carriers move through the base region formed by region 14 and are collected by region 20 which is reverse biased by the application of an appropriate potential to contact 44. The output signal passes to a load via contact 44.

Figure 7:
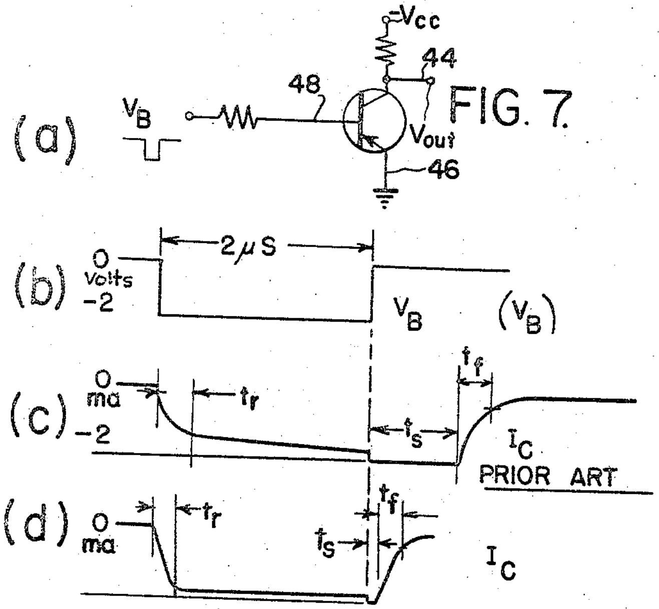

In the prior art structure of Lin et al. as described in the above-mentioned article, carriers would be injected across all parts of junction 34. Many of the carriers from sides 38 and 40 of the junction would reach sides 28 of junction 24 travelling in a direction parallel to surface 30. Many of the carriers injected from the bottom 36 of region 32 would not reach region 20 (i.e., the collector) and would be lost in region 10 and/or 14. Thus, the operation of the emitter would be inefficient and at best current gains approaching unity could be achieved. In this invention, the built-in field in the vicinity of the bottom 36 of junction 40 which results from the steep impurity concentration gradient inhibits the injection of carriers from emitter bottom 36, whereby injection of carriers take place predominantly from sides 38 and 40. This results in an efficient operation of the emitter with current gains improved substantially. In addition, the injected carriers flow primarily near surface 30, thus, traversing a substantially constant distance. In prior art devices, the carriers have traversed a distance that increases at locations removed from surface 30. This would result in deterioration of the frequency response of the device along with its pulse-response characteristics. The frequency response of the device is also improved by the graded base region which lowers the base transit time and the greater impurity concentration of the base which provides more recombination centers which lowers storage time. For example, with a pulse such as the one shown in FIG. 7(*b*) supplied to the base contact 48 of the lateral transistor in the circuit of FIG. 7(*a*), a prior art device would supply an output current pulse such as indicated in FIG. 7(*c*). The structure of FIG. 4 would provide a pulse such as shown in FIG. 7(*d*). It can be seen by comparing these curves [FIGS. 7(*c*) and 7(*d*)] that the rise time $t_r$ storage time $t_s$, and fall time $t_f$, all have been shortened by the invented structure. Typical structures fabricated in accordance with the invention would have current gains in the order of 2 to 3 with cutoff frequencies between 6 and 13 megacycles. For the same geometry without the invented bulk-injection suppression, graded base region, and higher impurity concentration in the base region, devices have been fabricated with a cutoff frequency less by one or two orders of magnitude. Thus, a lateral transistor structure is provided having improved current gain, frequency response and pulse-shaping characteristics.

The fabrication of the lateral transistor structure will now be described, wherein a silicon diffused device is produced. It is, of course, within the scope of the invention to employ other appropriate semiconductor materials. One method of fabrication is considered with respect to FIGS. 2–4 and another embodiment is shown with regard to FIGS. 5 and 6. Considering the embodiment shown in FIGS. 2–4, there is prepared a monocrystalline slice or substrate 12 which may be of n-type silicon (i.e., phosphorus-doped silicon) or p-type silicon (i.e., boron-doped silicon) the concentration of the impurity being of the order of about $10^{15}$ atoms per cubic centimeter. An impurity layer for region 15 is then formed by well-known photoengraving and impurity deposition techniques. Typically, region 15 would have an impurity concentration of at least $10^{20}$ atoms per cubic centimeter. The width $W_L$ (FIG. 2) region 15 is usually slightly smaller than the width $W_e$ of region 32 (FIG. 4). FIG. 2 is a simplified schematic showing the device as the process of epitaxial growth and diffusion are performed. The publication "Epitaxially Diffused Transistor Fabrication" by R. H. van Ligten, IBM Technical Disclosure Bulletin, vol. 4, No. 10, 1962, describes in detail the steps of forming region 15 by photoengraving and diffusion techniques. Details on the process and apparatus for the growth of an epitaxial layer can be found in U.S. Patent No. 3,165,811 Kleimack et al., and the above-mentioned publication. The grown epitaxial layer may have the same conductivity type as the substrate 12 or the substrate 12 may have a conductivity type different than the epitaxial layer. During the growth of epitaxial layer 14, the conditions for growth may be adjusted so that impurity region 15 diffuses outwardly as indicated by the arrows in FIG. 2. This results in graded higher impurity concentration region 17 as shown in FIG. 3. Out-diffusion from an impurity layer during the epitaxial growth is discussed in U.S. Patent No. 3,149,395, issued on Sept. 22, 1964, to A. R. Bray et al. and U.S. Patent No. 3,089,794, issued on May 14, 1963, to J. C. Marinace. In addition, the impurities imparted to body 10 by impurity region 15 extends outwardy a sufficient distance to provide a graded base region and a base of higher impurity concentration. It should be understood that the forming of higher impurity concentration region 17 by this out-diffusion may be limited during the formation of epitaxal layer 14 and may require additional processing subsequent to the formation of epitaxial layer 14. This will depend upon the material employed in impurity region 15 as well as the time and temperature employed during epitaxial growth.

Next, the regions 20 and 32 (FIG. 4) are formed by well-known photoengraving and diffusion techniques as described in U.S. Patent No. 3,025,389, issued on Mar. 20, 1962, to J. A. Hoerni. Both regions 20 and 32 may be diffused simultaneously with layer 42 first serving as the mask and then serving as the passivating layer which protects the formed junctions. The region 32 is formed in the vicinity of region 17 with its bottom in the vicinity of the higher concentration portions of region 17 (e.g., approxmately $10^{17}$ atoms per cubic centimeter or more) and its sides in the vicinity of the lower concentration portions of region 17 (e.g., less than $10^{17}$ atoms per cubic centimeter). The contacts 44, 46 and 48 are formed by well-known metallizing techniques such as described in U.S. Patent No. 2,981,877, issued on Apr. 25, 1961, to R. N. Noyce.

The above-described process results in a pn junction 34 being formed with substantially different impurity concentration gradients existing at two or more portions of the junction. Typically, there is at least an order of magnitude difference in the gradients. This enables injection from an emitter or other region to be controlled so that only predetermined portions of the region are effective during injection. Other portions of the region are suppressed during injection. The process incident to the formation of the junction provides a graded base region of impurity concentration higher than the bulk.

Figure 5:
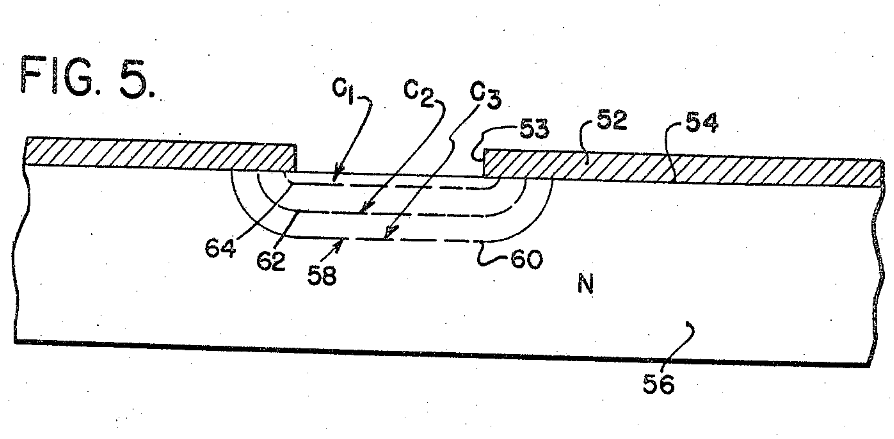
FIGS. 5 and 6 are enlarged sectional views of an alternate embodiment of the invention taken along lines 2—2 and showing the device at various stages of fabrication; and, FIG. 7 is a series of graphs showing the characteristics of the pulse from the collector resulting from the particular input pulse to the base of a lateral transistor in the circuit of FIG. 7(*a*).
Figure 6:
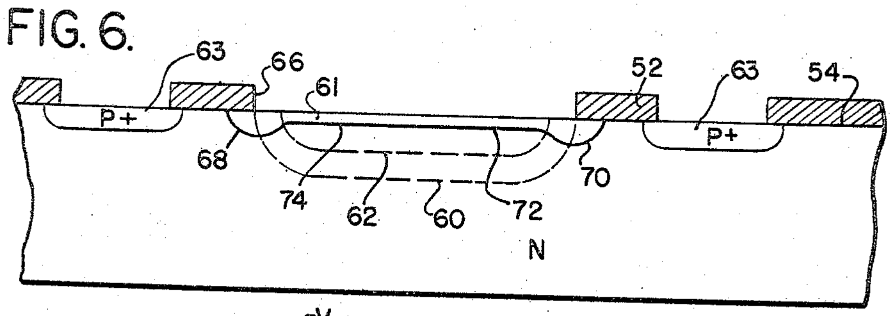

An alternate method for forming a junction having a relatively high impurity gradient at its bottom and a relatively low impurity gradient at its sides is shown in FIGS. 5 and 6. In this method a mask 52 having an opening 53 is formed on the surface 54 of body 56 (FIG. 5). Typically, the body 56 is monocrystalline silicon and the mask 52 is thermally or pyrolytically formed silicon dioxide with an opening 53 produced by well-known photoengraving techniques. Next, an impurity of the same conductivity type as body 56 is diffused through opening 53 to form a region 58 of higher impurity concentration than body 56. Typically, phosphorus is employed as an impurity with the impurity concentration of the body 56 being $10^{15}$ atoms per cubic centimeter. The region 58 may have an impurity concentration of approximately $10^{16}$ atoms per cubic centimeter at the boundary line 60. The broken lines 62 and 64 indicate lines of higher impurity concentration such as $10^{17}$ atoms per cubic centimeter and $10^{18}$ atoms per cubic centimeter, respectively. The surface concentration may be approximately $10^{19}$ atoms per cubic centimeter. The boundary line 60 of region 58 may be from 1 to 5 microns or so from surface 54. It is preferred that the line 60 be no greater than 2 to 3 microns from surface 54 and that along this concentration line the impurity concentration should be approximately no less than an order of magnitude greater than the concentration of body 56.

Next, the emitter 61 and collector 63 are formed by diffusion and photoengraving techniques such as employed in forming impurity concentration region 58. The emitter 61 and collector 63 have a conductivity type opposite body 56 and region 58, such as a p-type conductivity, formed with boron as the impurity. The opening 66 in the mask during the formation of emitter 61 is larger than opening 53 employed during the formation of region 58. The increase in the opening during the formation of emitter 61 performs the important function of enabling the sides 68 and 70 of junction 72 to be formed in the vicinity of a region having a relatively low impurity concentration, that is, only slightly higher than the impurity concentraton of body 56. In comparison, the bottom 74 of junction 72 is formed in the vicinity of a relatively high opposite-type impurity concentration region. The impurity concentration gradient in the vicinity of bottom 74 is preferably an order of magnitude greater than the impurity concentration gradient in the vicinity of sides 68 and 70. Thus, the method illustrated in FIGS. 5 and 6 provides a junction similar to the one provided by the method shown in FIGS. 1–4. This method is decidedly simpler than the one shown in FIGS. 1–4. However, since the surface concentration of the phosphorus diffused into region 58 is nearly comparable to the surface concentration of the boron diffused into region 61, the surface may be nearly compensated, making it difficult to obtain a reliable ohmic contact, and providing a limited emitter injection.

In summary, an improved lateral transistor structure has been described along with a method for forming such a structure as well as other structures. No effort has been made to exhaust the possible embodiments of the invention. It will be understood that the embodiment described is merely illustrative of the preferred form of the invention and various modifications may be made therein without departing from the scope and spirit of this invention. For example, although the invention is described in terms of a specific structure, it may be practiced on one or more portions of more complicated structures, such as integrated circuits, or it may be practiced in simpler environments, such as single transistors. In addition, the conductivity types of the transistor may be reversed with impurity concentrations and gradients different from the examples described.

What is claimed is:

1. A lateral transistor comprising:

a monocrystalline body having a first conductivity type and a surface, said body having a limited region of impurities of the same conductivity type and lower resistivity than the remainder of said body;

a first monocrystalline region having a conductivity type opposite said body and located adjacent said body to form a first pn junction therewith, said pn junction having a bottom and sides with said sides extending to said surface; and, a second monocrystalline region having a conductivity type opposite to said body and located adjacent said body to form a second pn junction therewith, said second pn junction having a bottom lying in close proximity to said region of impurities, and sides extending to said surface, at least one of said sides of said second junction being in very close proximity to one of said sides of said first junction to enable a current to flow from said one side of said second junction to said one side of said first junction, the bottom of said second junction having an impurity gradient at least an order of magnitude greater than the sides of said second junction, whereby said lateral transistor displays an improved current gain and frequency response.

References Cited

UNITED STATES PATENTS 3,246,214 4/1966 Hugle ------------- --317—235

JOHN W. HUCKERT, *Primary Examiner.*

R. SANDLER, *Assistant Examiner.*